United States Patent [19]

Majos et al.

[11] Patent Number: 5,319,369
[45] Date of Patent: Jun. 7, 1994

[54] PARALLEL-TO-SERIAL CONVERTER

[75] Inventors: Jacques Majos, Le Versoud; Alain Chemarin, St Bernard du Touvet, both of France

[73] Assignee: France Telecom, Paris, France

[21] Appl. No.: 93,584

[22] Filed: Jul. 19, 1993

[30] Foreign Application Priority Data

Jul. 20, 1992 [FR] France .................... 92 08940

[51] Int. Cl.[5] .......................................... H03M 9/00
[52] U.S. Cl. .................................................. 341/101
[58] Field of Search ...................... 341/101, 61, 68; 328/15, 16; 307/271

[56] References Cited

U.S. PATENT DOCUMENTS

| | | | |
|---|---|---|---|
| 3,631,464 | 12/1971 | Dahlberg | 341/101 |
| 4,218,758 | 6/1978 | Allen et al. | 341/101 |
| 5,107,264 | 4/1992 | Novof | 341/101 |

Primary Examiner—Brian K. Young
Attorney, Agent, or Firm—Laubscher & Laubscher

[57] ABSTRACT

Typically, a parallel-to-serial converter comprises a parallel-to-parallel register and a parallel-to-serial register. According to the prior art, a first clock signal the transfer of incoming parallel data words to outputs of the parallel-to-parallel register whereas the loading of the parallel-to-parallel register is rhythmed by a second clock signal which is independent of the first clock signal. According to the invention, a local base time produces the second loading clock signal and two clock signals substantially in phase-opposition so that there is time dependence between these signals. A phase analyzing circuit derives a control signal for selecting one of the two clock signals which are in phase-opposition as a function of a phase shift between the incoming parallel data words and the first clock signal.

12 Claims, 6 Drawing Sheets

PARALLEL-TO-SERIAL CONVERTER

BACKGROUND OF THE INVENTION

1. Field of the Invention

This invention relates to a parallel-to-serial converter intended to serialize a data signal that is phase shifted with regard to a local clock signal.

Typically a parallel-to-serial converter comprises a bus receiving incoming parallel data from a processing device and reproduces this data in serial form in a transmission medium. Such a converter comprises at least one parallel-to-parallel register and one parallel-to-serial register.

These two registers are constituted of logic flip-flops and are connected in cascade in the converter. The parallel-to-parallel register receives incoming parallel data which it then transfers, at the rate of a first clock signal, to an output bus applied to inputs of the parallel-to-serial register. The parallel-to-serial register is loaded at the rate of a second clock signal by this transferred data which is then serialized for transmission in the transmission medium.

2. Description of the Prior Art

According to the prior art, the first and second clock signals having the same frequency are independent of each other in terms of phase. Indeed according to conventional embodiments, a phasor is provided in the converter to generate the first clock signal which rhythms the transfer of data outgoing from the parallel-to-parallel register whereas a time base in the converter provides the second clock signal independently of the first clock signal. The phasor is used to generate the first clock signal with a phase which is a function of the phase of the incoming parallel data. Since both registers are essentially designed with logic flip-flops, their operation depends on logic transition times (rising or falling edges) of the clock signals. It is natural, therefore, at high transfer rates, that times of transfer of incoming parallel data to the outputs of the parallel-to-parallel register coincide with loading times for this data at the outputs of the parallel-to-parallel register in the parallel-to-serial register. In this precise situation, loading of the parallel-to-parallel register can lead to loss of data due to the fact that sampling times concerning loading of data into the parallel-to-serial register do not correspond to durations during which the data are stable at the outputs of the parallel-to-parallel register.

OBJECT OF THE INVENTION

The main object of this invention is to remedy the preceding disadvantages particularly by providing a parallel-to-serial converter in which rhythming clock signals of the parallel-to-parallel register and those of the parallel-to-serial register are interdependent.

SUMMARY OF THE INVENTION

Accordingly, there is provided a parallel-to-serial converter receiving from a digital processing device incoming data words each having M parallel bits for converting them into serialized bits transmitted at a first frequency to a transmission medium, comprising:

a time base receiving a clock signal at the first frequency and producing (1)—a loading clock signal at a second frequency M times less than the first frequency to rhythm a loading of the incoming data words which are received and which are previously transferred to outputs of a parallel-to-parallel register in a parallel-to-serial register, (2)—a first clock signal at the second frequency transmitted to the digital processing device to synchronize it, and (3)—two second clock signals at the second frequency and substantially in opposition of phase to each other, and a phase analyzing means for analyzing the phase of said incoming data words compared to the phase of the first clock signal in order to select the two second clock signals according to whether the incoming data words and the first clock signal are approximately in phase and in opposition of phase, respectively, in a selected clock signal which rhythms a transfer of the incoming data words to the outputs of the parallel-to-parallel register.

In one preferred embodiment of the invention, the phase analyzing means comprises:

a parallel-to-serial converter and wherein the phase analyzing means comprises:

several cascade-connected delay means imposing delays the sum of which defines a predetermined phase analysis duration, to delay one of predetermined of M bit signals relative to the M parallel bits in the incoming data words in several delayed signals, respectively, the analysis duration being less than a half-period of the clock signals at the second frequency, several sampling means for sampling the first clock signal in response to predetermined logic transitions in the one predetermined of the M bit signals and the delayed signals in order to produce several sampling signals respectively, and a logic means for generating as a function of two of the several sampling signals a control signal whose two logic states select the two second clock signals, respectively.

Moreover, in order to remedy jitter in incoming data which particularly affects converter operating initiation, the phase analyzing means further comprises a means for forcing the control signal into a forced signal at a given state selecting one of the two second clock signals during an initial operating stage of the parallel-to-serial converter, and the one predetermined of the M bit signals is received through a control signal initiating means to initiate to a stable definitive state during the initial procedure the forced control signal independently of any phase jitter in the incoming data words less than a maximal phase jitter.

A preferred embodiment is that the maximum phase jitter is substantially equal to the difference between the half-period of the clock signals at the second frequency and the phase analysis duration.

BRIEF DESCRIPTION OF THE DRAWINGS

Further features and advantages of the invention will be apparent from the following particular description of two preferred embodiments of this invention as illustrated in the corresponding accompanying drawings in which.

DESCRIPTION OF THE PREFERRED EMBODIMENTS

Figure 1:
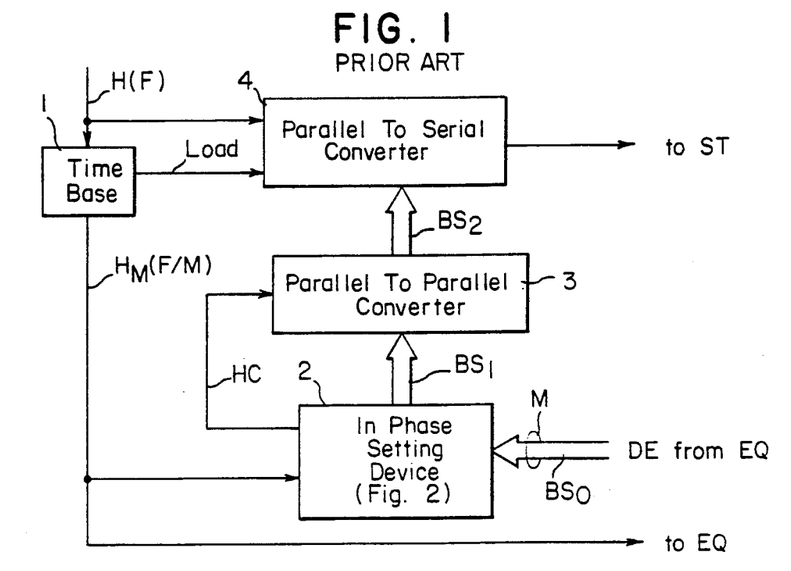
FIG. 1 is a schematic block diagram of a parallel-to-serial converter according to prior art.

With reference to FIG. 1, a parallel-to-serial converter according to the prior art receives from a remote digital processing device EQ data DE in the form of words each having M parallel bits in a input bus $BS_O$ with M wires, and outputs this data in serial form in a transmission medium ST. The known converter comprises a time base 1, an in-phase setting device 2, parallel-to-parallel register 3 and a parallel-to-serial register 4.

The time base 1 receives a serial processing clock signal H at a first frequency F and produces a loading signal LOAD and a parallel processing clock signal $H_M$ at a second frequency F/M, M referring to the number of wires in the input bus $BS_O$ in the parallel-to-serial converter. The H and LOAD signals are applied to two respective inputs in the parallel-to-serial register 4. The clock signal $H_M$ is applied to an input in the in-phase setting device 2 and is transmitted to the remote processing device EQ as a reference clock signal. Given this reference clock signal $H_M$, the remote processing device has a frequency (F/M) and a reference phase to transmit at the frequency data words DE with M parallel bits in the bus $BS_O$, the integer M being typically equal to eight. Depending on the received data words and the clock signal $H_M$, device 2 produces a corrected clock signal HC in order to correctly sample the data DE signal. This signal HC results from phase correction of the clock signal $H_M$ which depends on the distance separating the remote processing device EQ from the converter and introducing a phase shift in incoming data DE compared to the local parallel processing clock signal $H_M$.

The corrected clock signal HC is applied to a clock input of the parallel-to-parallel register 3 which also receives the incoming data words DE through an output bus $BS_1$ with M wires from the in-phase setting device 2. In register 3, data words DE are transferred at the rate of signal HC to data inputs in the parallel-to-parallel register 4 through an output bus $BS_2$ with M wires. The loading signal LOAD controls the loading of M bits of each of the data words present in the bus BS2 into M buffer memory cells of the parallel-to-serial register 4. These word bits stored in parallel form in the parallel-to-serial register 4 are then read one by one under the control of the serial processing clock signal H for transmission in serial form to the transmission medium ST. The loading signal LOAD is a periodic pulse signal the pulse width of which is equal to one period of the serial processing clock signal H, and of which the period is equal to M periods of this clock signal H.

It appears according to this known embodiment that rising edges of the corrected clock signal HC will be positioned in a "pseudo-random" way in relation to rising edges of pulses of the loading signal LOAD. Consequently/ stability of data during a transfer phase between registers 3 and 4 is not guaranteed and may result in loss of data.

Moreover a phase jitter may be already present in incoming data DE. This jitter changes the phase of the corrected clock signal HC, giving rise to transfers between registers 3 and 4 at variable unpredictable times and which hinder the operation of the converter.

The first disadvantage mentioned above is due to the independence of the corrected clock signal HC in relation to any time reference, unlike the loading signal LOAD provided by local time base 1. A shift of one of the HC and LOAD signal phases in relation to the other is thus engendered.

Figure 2:
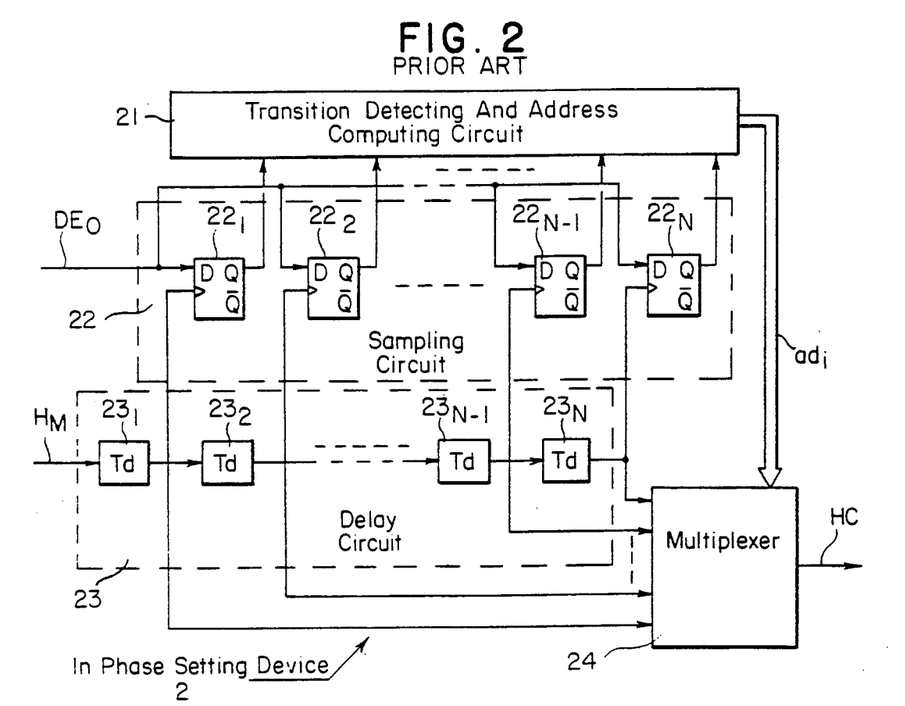
FIG. 2 is an schematic block diagram of a in-phase setting device included in the parallel-to-serial converter shown in FIG. 1.

FIG. 2 shows in detail a known embodiment of the in-phase setting device 2 included in the converter shown in FIG. 1. The in-phase setting device 2, also called "phasor", comprises a transition detecting and address computing circuit 21, a sampling circuit 22, a delay circuit 23 and an N-to-1 multiplexer 24.

The delay circuit 23 comprises N series-connected delay lines $23_1$ to $23_N$ with an elementary delay Td. The parallel processing clock signal $H_M$ produced by the time base 1 is applied to an input of the first delay line $23_1$, and each one $23_n$ of the delay lines $23_1$ to $23_N$ reproduces on output this $H_M$ clock signal delayed by (n.Td), with $1 \leq n \leq N$. Thus the $H_M$ clock signal is delayed by multiples of an elementary delay Td at the respective outputs of the delay lines 231 to 23N, into a plurality of phase shifted clock signals. These phase shifted clock signals are applied on the one hand to N inputs of the multiplexer 24 and on the other hand to N clock inputs of the sampling circuit 22, respectively.

The sampling circuit 22 comprises N D-type flip-flops $22_1$ to $22_N$ each receiving through its data input D one of the parallel bits of the incoming data words DE received through one of the M wires in the bus $BS_O$, and marked $DE_O$. The phase shifted clock signals produced at the outputs of the delay lines $23_1$ to $23_N$ are respectively applied to the clock inputs of flip-flops $22_1$ to $22_N$. Outputs Q of flip-flops $22_1$ to $22_N$ are applied to respective inputs of the transition detecting and address computing circuit 21. In flip-flops $22_1$ to $22_N$, the incoming data bit DEO is respectively sampled at times Td, (2.Td), ..., (N.Td) following on a rising edge of signal $H_M$. Outputs Q of the flip-flops are discretely representative of the logic state, "1" or "0", of the incoming data bit $DE_O$ at the different successive respective sampling times. By suitably choosing the Td delay imposed by each of the delay lines $23_1$ to $23_N$, the Q outputs of the flip-flops indicate the time location of a rising or falling edge of the bit, and more generally, transitions in the data signal DE. Thus, for example, levels "1" and "0" produced respectively at the outputs of flip-flops $21_1$ to $21_i$ and $22_{i+1}$ to $22_N$ in which i is any integer index between 1 and N, identify the location of a rising edge of signal $DE_O$ and therefore a logic transition for each of the bits of the signal DE, in substantial phase correspondence with the rising edge of the phase shifted clock signal produced at the output of the ith delay line $23_i$.

Depending on the states of outputs Q of the flip-flops in the sampling circuit 22, circuit 21 derives an address $ad_i$ which corresponds to the index of flip-flop $21_i$ according to the example above. The address adi is applied to selection inputs ES of the multiplexer 24 so as to select the phase shifted clock signal produced by the delay line $23_i$ among the N phase shifted clock signals so as to produce the corrected clock signal HC on output of multiplexer 24.

Figure 3:
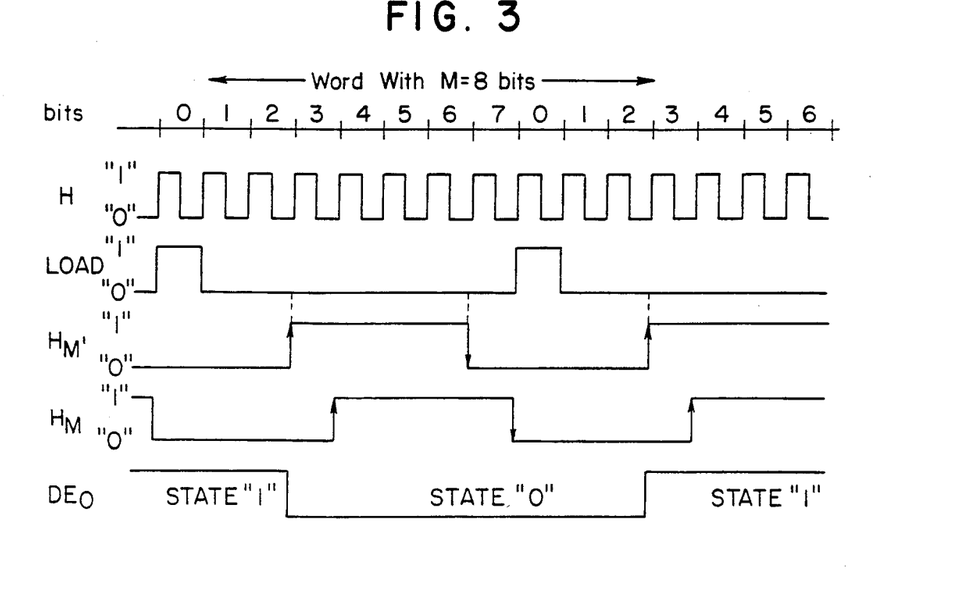
FIG. 3 shows a time diagram of logic signals relative to the operating of the parallel-to-serial converter embodying the invention.

The time diagram in FIG. 3 concerns the planned operation of a parallel-to-serial converter embodying the invention. In this diagram it is supposed that parallel incoming data DE in bus $BS_O$ are words with $M=8$ parallel bits. The main disadvantage of the parallel-to-serial converter according to the prior art presented above lies in the fact that the phase corrected clock signal HC, the rising edges of which cause data to be transferred from the bus $BS_1$ to bus $BS_2$, is independent of the LOAD signal to load data from the bus $BS_2$ in the parallel-to-serial register 4. According to the invention, both the LOAD loading signal, shown on a third line in FIG. 3, and a $H_M'$ clock signal, shown on a fourth line, are produced by a same local time base included in the converter. This $H_M'$ clock signal with a period M/F, equal to a duration of incoming data DE word time, has rising and falling edges substantially located between two pulses of signal LOAD. Depending on the substantially incoming data phase, either the $H_M'$ clock signal or the signal complementary to this signal, written $\overline{H_{M'}}$, is selected into a selected clock signal HS which presents the most appropriate rising edges required to coincide with middles of the word time of incoming data DE so that the latter can be correctly sampled for their transfer in bus $BS_2$.

Figure 4:
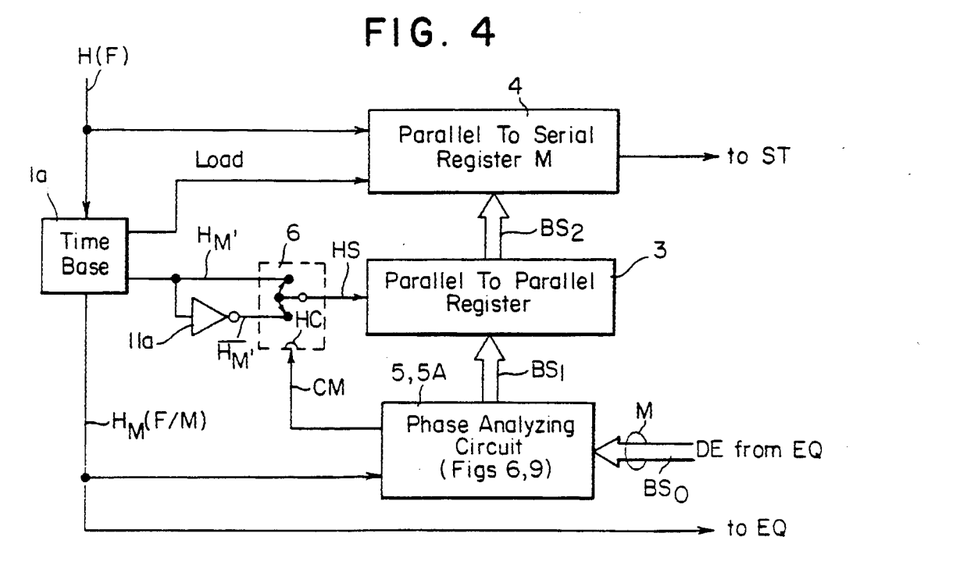
FIG. 4 is a block diagram of a parallel-to-serial converter embodying the invention.

With reference to FIG. 4, a parallel-to-serial converter embodying the invention comprises a time base 1a, a logic inverter, the two parallel-to-parallel and parallel-to-serial registers 3 and 4, a phase analyzing circuit 5 and an electronic switch 6.

The time base 1a receives a serial processing clock signal H with a frequency F and produces a loading signal LOAD which is applied to a loading input of the parallel to serial register 4, and first and second parallel processing clock signals $H_M$ and $H_M'$. The first signal $H_M$ is applied to an input of the analyzing circuit 5 and is also transmitted to a remote processing device EQ for transmission by the latter of data words each having M parallel bits at the frequency of signal $\overline{H_M}$ in a bus $BS_O$ connected to inputs of circuit 5.

The second parallel processing clock signal $\overline{H_{M'}}$, substantially phase shifted in relation to the signal $H_M$ for reasons to be explained later, is applied to two inputs of switch 6 directly and through the inverter 11a, respectively. The second parallel processing clock signal $\overline{H_{M'}}$ and a second complementary or inverted parallel processing clock signal $H_{M'}$ are thus applied to two respective inputs of switch 6. Depending on the phase shift between the incoming parallel data DE and the first parallel processing clock signal $H_M$, the phase analyzing circuit 5 produces a logic control signal CM which is applied to a control input EC of switch 6. In practice, switch 6 may be a 2-to-1 multiplexer. The logical state of the control signal CM at a given time selects one of the two second clock signals $H_M'$ and $\overline{H_{M'}}$ into the selected clock signal HS to be applied to a clock input of the parallel-to-serial register 3 to rhythm transfer of incoming data words DE in the bus $BS_2$.

Referring back to FIG. 3, it appears that a necessary condition for the proper operation of the parallel-to-serial converter embodying the invention consists in that rising edges of the pulses of loading signal LOAD, having a width equal to one period of the clock signal H and delivered every M periods of the clock signal H must each substantially succeed successive rising and falling edges in the second parallel processing clock signal $H_M'$, being known that a falling edge of signal $H_M'$ corresponds to a rising edge of the complementary signal $\overline{H_{M'}}$.

In the embodiments of the phase analyzing circuit 5 described hereafter and included in the parallel-to-serial converter embodying the invention, the integer M is taken to be equal to 8. Thus all incoming parallel data DE are transmitted in the form of words with 8 parallel bits in the bus $BS_O$. Therefore an incoming data word DE is written in the form of a byte ($DE_0$, $DE_1$, $DE_2$, $DE_3$, $DE_4$, $DE_5$, $DE_6$, $DE_7 = DE_{M-1}$).

Figure 6:
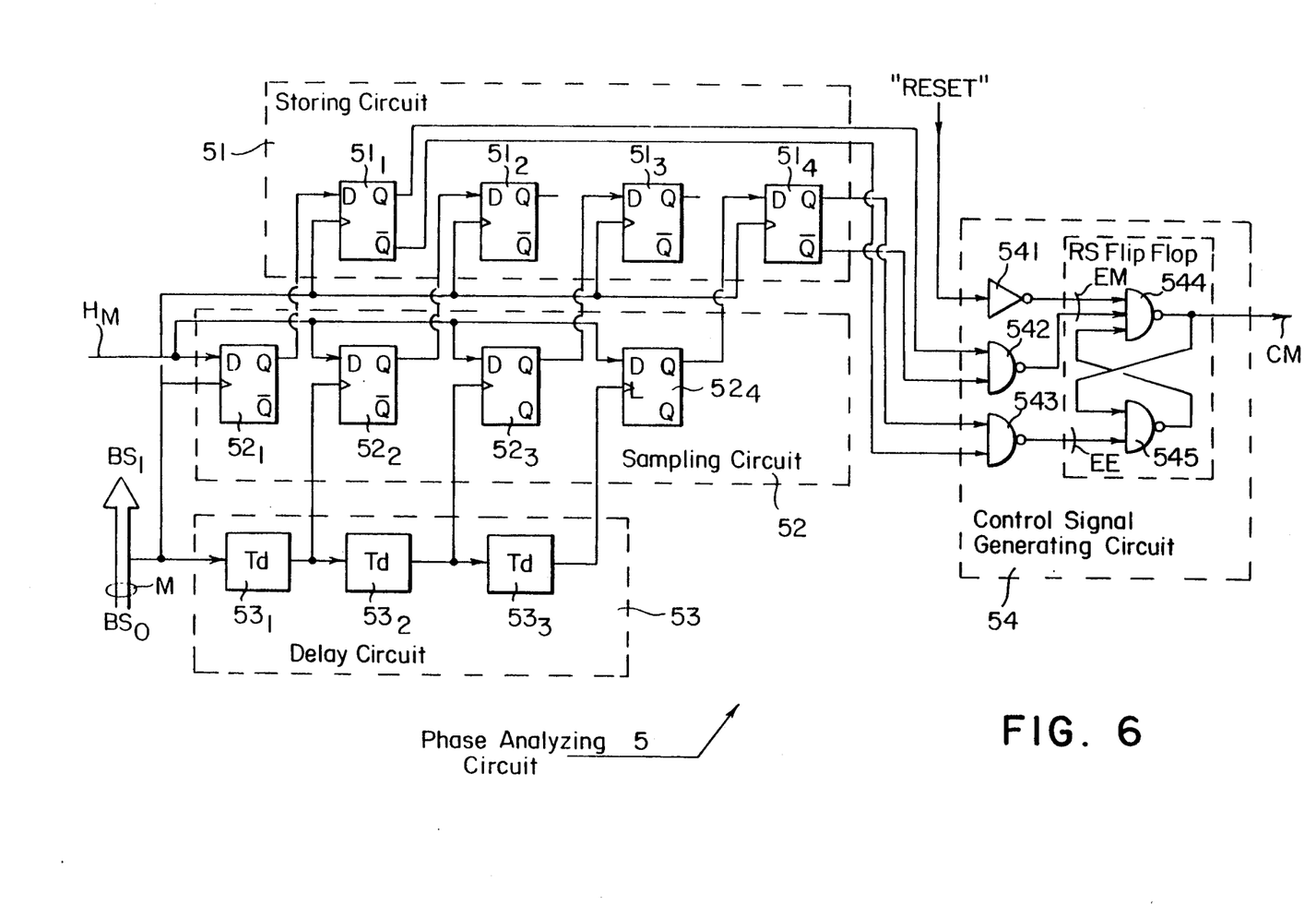
FIG. 6 shows a block diagram of a first embodiment of a phase analyzing circuit included in the parallel-to-serial converter according to the invention.

In reference to FIG. 6, the phase analyzing circuit 5 comprises a storing circuit 51, a sampling circuit 52, a delay circuit 53 and a control signal generating logic circuit 54. For example only one of the bits in the incoming data words DE, namely the low order bit $DE_O$, is used as predetermined bit signal by the analyzing circuit 5 in the converter embodying the invention, even though any of the bits in a data word with $M=8$ parallel bits transmitted in input bus $BS_O$ can be used since all the bits of a word in the respective wires of bus $BS_O$ present strictly identical phases and frequencies.

For example the delay circuit 53 comprises three delay lines $53_1$, $53_2$ and $53_3$ in series, the first of which receives the predetermined bit signal $DE_O$ from each of the incoming data words DE. Each delay line $53_1$ to $53_3$ delays the bit it receives by one predetermined elementary delay Td. At the outputs of the three delay lines $53_1$ to $53_3$, are thus obtained, delayed low order bit signals, i.e., respectively phase shifted by multiples of an elementary phase shift $(2\pi . Td/T_M)$ in which $T_M = M/F$ is the period of incoming data words. The low order bit signal $DE_O$ and the phase shifted signals issued from the delay lines $53_1$ to $53_3$ are respectively applied to the clock inputs of four D type flip-flops, $52_1$, $52_2$, $52_3$ and $52_4$ constituting the sampling circuit 52.

Flip-flops $52_1$ to $52_4$ each receive the first clock signal $H_M$ at their data input D. In these various flip-flops $52_1$ to $52_4$, the first clock signal $H_M$ is sampled by the phase shifted signals with different phases, in response to each of the rising edges of the low order bit signal that is not phase shifted (not delayed) $DE_O$. Four logic states resulting from the sampling of the first clock signal $H_M$ as a function of the different successive phases are thus respectively provided by the Q outputs of the four flip-flops $52_1$ to $52_4$ in the sampling circuit 52. The outputs Q of the four flip-flops $52_1$ to $52_4$ are respectively applied to the data input D of D type flip-flops, $51_1$, $51_2$, $51_3$ and $51_4$ in the storing circuit 51. The clock input of each flip-flop 511 to $51_4$ receives the predetermined bit signal $DE_O$. Thus in response to a rising edge of the $DE_O$ signal, the logic states of the first clock signal $H_M$ sampled by the different phase shifted signals are stabilized in circuit 51 and reproduced in synchronism with the next rising edge in the $DE_O$ signal at the outputs Q of flip-flops $51_1$ to $51_4$. Direct Q and inverted Q outputs of two of the flip-flops $51_1$ to $51_4$, namely those of the first and last flip-flops $51_1$ and $51_4$ of the sampling circuit 51, are connected to respective inputs of the control signal generating circuit 54 which also receives a reset signal RESET. Circuit 54 generates the control signal CM depending particularly on sampling signals $Q_1$, $\overline{Q_1}$, $Q_4$ and $\overline{Q_4}$ at the outputs of flip-flops $51_1$ to $51_4$ to control switch 6 (FIG. 4) so as to select either the second clock signal or the second inverted clock signal $H_{M'}$.

Figure 5:
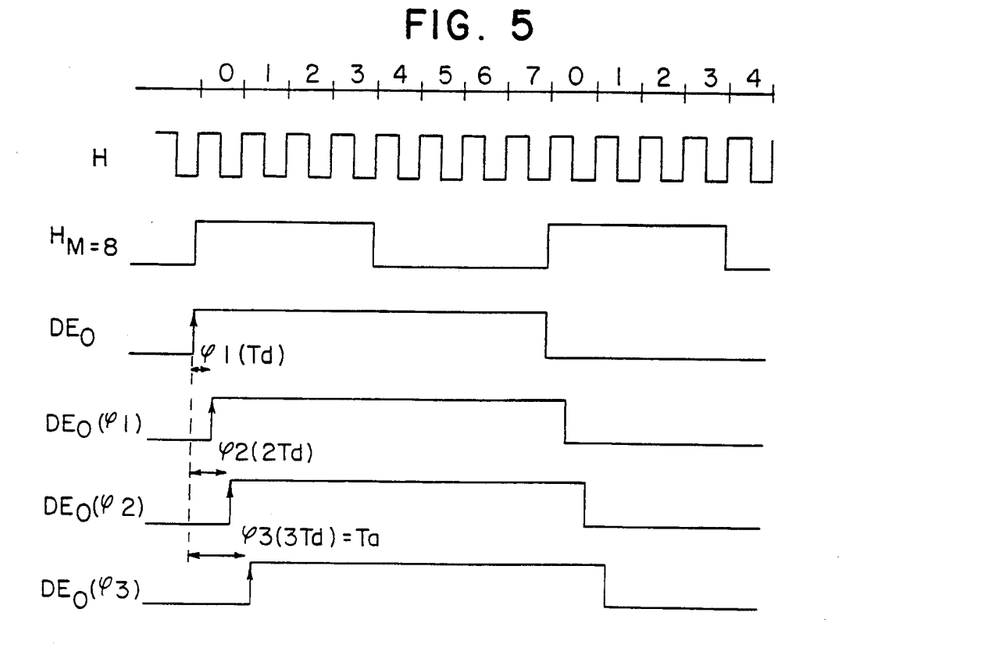
FIG. 5 is a sampling time diagram.
Figure 7:
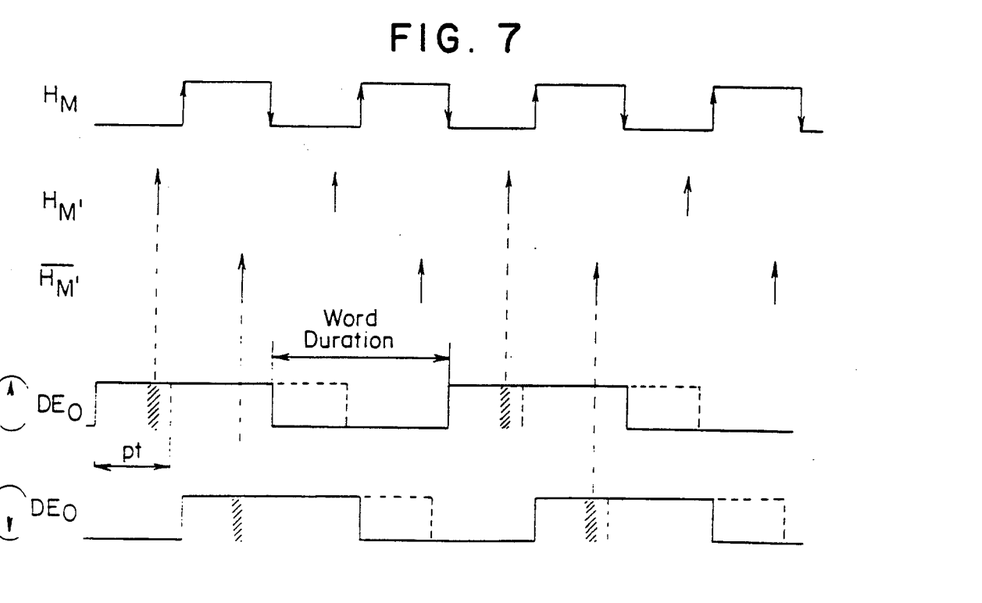
FIG. 7 shows a time diagram relative to the choice of one of two "second" clock signals to control a transfer of incoming data words to outputs of a parallel-to-parallel register included in the parallel-to-serial converter embodying the invention.

Before coming back in detail to the control signal generating circuit 54, we refer now to FIGS. 5 and 7 to describe the operation of the phase analyzing circuit 5.

The time diagram shown in FIG. 5 concerns scanning of the $H_M$ signal by sampling circuit 52. A third line in this time diagram shows the first clock signal $H_M$ which is applied to each of the data inputs D of flip-flops $52_1$ to $52_4$ in the sampling circuit 52. Fourth, fifth, sixth and seventh lines show respectively the low order bit signal $DE_O$ of incoming data and signals resulting from phase shift or delay of the signal $DE_O$ at the outputs of the three delay lines $53_1$ to $53_3$.

The rising edges of each of these signals constitute sampling times of the first clock signal $H_M$ in flip-flops $52_1$ to $52_4$. These different successive sampling times are contained in a phase analysis duration Ta, equal to 3.Td, of the first clock signal $H_M$. Particularly these different sampling times of the first clock signal $H_M$ enable the starting points of word times (rising edges) of incoming data to be located relative to rising or falling edges of the first clock signal $H_M$ in order to select either the second clock signal $H_{M'}$, or the second inverted clock signal $H_{M'}$, as clock signal HS to transfer incoming data words DE in bus $BS_2$. The operation of the parallel-to-serial converter embodying the invention must satisfy the two following conditions:

firstly, to transfer incoming data DE in bus $BS_2$, whichever of the clock signals $H_{M'}$ or $H_{M'}$ rising edges which are best centered in the word-time durations of incoming data DE must be selected or in other words, with rising edges furthest away from incoming data transition zones near the start and end of word-time, these zones being by their very nature unstable, and secondly, to sample and store data words present in the bus $BS_2$, the loading signal LOAD in the parallel-to-serial register 4 must have sampling rising edges relatively distant in terms of time from the rising edges of clock signals $H_{M'}$ and $H_{M'}$ so that data words are stable in the bus $BS_2$ after their transfer, byte by byte in the case of M=8, under the control of the appropriate HS clock signal, i.e. $H_{M'}$ or $H_{M'}$.

By referring to FIG. 5 and taking into account the first condition mentioned above, two kinds of information can be extracted concerning the analysis duration Ta or, which implies the same, the sum of elementary delays Td imposed by the delay lines $53_1$ to $53_3$. Firstly, this analysis duration Ta must be less than half the period of the first clock signal $H_M$ so as to detect at most one rising or falling edge in this clock signal $H_M$, the detection of one single edge being sufficient to "locate" the incoming data word phase in relation to the clock signal $H_M$. Moreover, this analysis duration Ta must be greater than a minimal time for prepositioning incoming data words DE at the inputs of the parallel-to-parallel register 3. Without this, it would not be possible to "locate" in a sufficiently large time range the phase of incoming data words DE in relation to clock signal $H_M$ and thus to ascertain that starts of word times of incoming data words DE are not located adjacent to the rising edges of one of the two clock signals $H_{M'}$ and $H_{M'}$ selected into the HS signal.

The time diagram in FIG. 7 aims at establishing a correspondence between the different sampling states which may be produced at the outputs of flip-flops $51_1$ to $51_4$ of the storing circuit 51 and the clock signal $H_{M'}$ or $H_{M'}$ to be selected as the clock signal for transfer of incoming data words DE in the bus $BS_2$.

It must be noted that one $H_{M'}$ of the two second clock signals is substantially in phase lead in relation to the first clock signal $H_M$, and the other second clock signal $H_{M'}$ is by definition in phase opposition with respect to signal $H_M$. In a fourth line in FIG. 7 a time range pt is defined in which the start of word times of incoming data DE can be temporarily located, given that a rising edge of signal $H_M$ is detected by means of flip-flops $51_1$ to $51_4$ in the storing circuit 51, taking into account the upper and lower limits of the analysis duration Ta such as defined previously. In the case of detection of a rising edge of signal $H_M$ by sampling by means of the signal $DE_O$, each one of the incoming data words DE is necessarily included between two maximal phases such as shown with unbroken and broken lines in the fourth line of FIG. 7, respectively. In this case, it appears that the inverted clock signal $H_{M'}$ must be chosen to sample the incoming data DE so as to transfer them in the bus $BS_2$ at the inputs of the parallel-to-serial register 4. Indeed, as shown by the slim hachured zones on this fourth line, if the signal $H_{M'}$ were selected to sample incoming data DE, sampling times could substantially coincide with starts of word times of incoming data DE, such a coincidence being likely to cause loss of data to be transferred in the bus $BS_2$.

A fifth line in FIG. 7 shows that in case a falling edge of the signal $H_M$ is detected in successive samplings by the delayed $DE_O$ signal, the second clock signal $H_{M'}$ must be selected to sample the incoming parallel data to transfer them in the bus $BS_2$.

Two particular cases have deliberately been omitted above, namely cases in which neither the rising nor falling edge of the first clock signal $H_M$ are detected. These cases correspond to the same logic state, "1" or "0", at the Q outputs of all flip-flops $51_1$ to $51_4$ in the storing circuit 51. Coming back to FIG. 7 and maintaining the hypothesis that the analysis duration Ta is strictly greater than a minimal prepositioning duration of each of the incoming data words DE and is strictly less than a half-period of the first clock signal $H_M$, the case below is studied whereby all storing flip-flops $51_1$ to $51_4$ store a state "1". Such storage may occur when it succeeds an earlier storage, or else states "0", "1", "1" and "1", or else states "1", "1", "1", "0" in flip-flops $51_1$ to $51_4$, respectively depending on the shift direction of the phase of of incoming data DE in relation to the phase of the clock signal $H_M$.

If the states "1", "1", "1" and "1" follow the states "0", "1", "1" and "0" at the outputs to flip-flops $51_1$ to $51_4$, this means, when referring to the fourth line of FIG. 7, that incoming data DE is therefore substantially in phase lead for the states "1", "1", "1" and "1" in relation to the word time shown by a dotted line and corresponding to the states "0", "1", "1" and "1". The clock signal $H_{M'}$ is then maintained so as to ensure a proper operation of the parallel-to-serial converter and to avoid a harmful change of the phase of the selected clock signal HS which orders the transfer of incoming data words to the outputs of the parallel-to-parallel register 3.

If the states "1", "1", "1" and "1" follow the states "1", "1" "1" and "0", this means, when referring to the fifth line of FIG. 7, that incoming data words DE are therefore substantially in phase lag in relation to the word time shown by an unbroken line on the fifth line and corresponding to the states "1", "1" "1" and "0". The second clock signal $H_{M'}$ is then maintained to sample incoming data DE so as to reproduce this data at the outputs to the parallel-to-parallel register 3.

Through identical reasoning, a similar result is obtained for states "0", "0", "0" and "0" stored at the outputs of flip-flops $51_1$ to $51_4$ of the storing circuit 51 by maintaining the second clock signal $H_{M'}$ or $H_{M'}$ selected previously.

Consequently, a truth table TV can be established as follows:

| OUTPUTS Q OF FLIP-FLOPS | | | | SELECTED CLOCK SIGNAL |
|---|---|---|---|---|
| $51_1$ | $51_2$ | $51_3$ | $51_4$ | |
| 0 | 0 | 0 | 0 | PREVIOUS |
| 0 | 0 | 0 | 1 | $H_{M'}$ (CM = 0) |
| 0 | 0 | 1 | 1 | $H_{M'}$ (CM = 0) |
| 0 | 1 | 1 | 1 | $H_{M'}$ (CM = 0) |
| 1 | 1 | 1 | 1 | PREVIOUS |
| 1 | 1 | 1 | 0 | $H_{M'}$ (CM = 1) |
| 1 | 1 | 0 | 0 | $H_{M'}$ (CM = 1) |
| 1 | 0 | 0 | 0 | $H_{M'}$ (CM = 1) |

Figure 9:
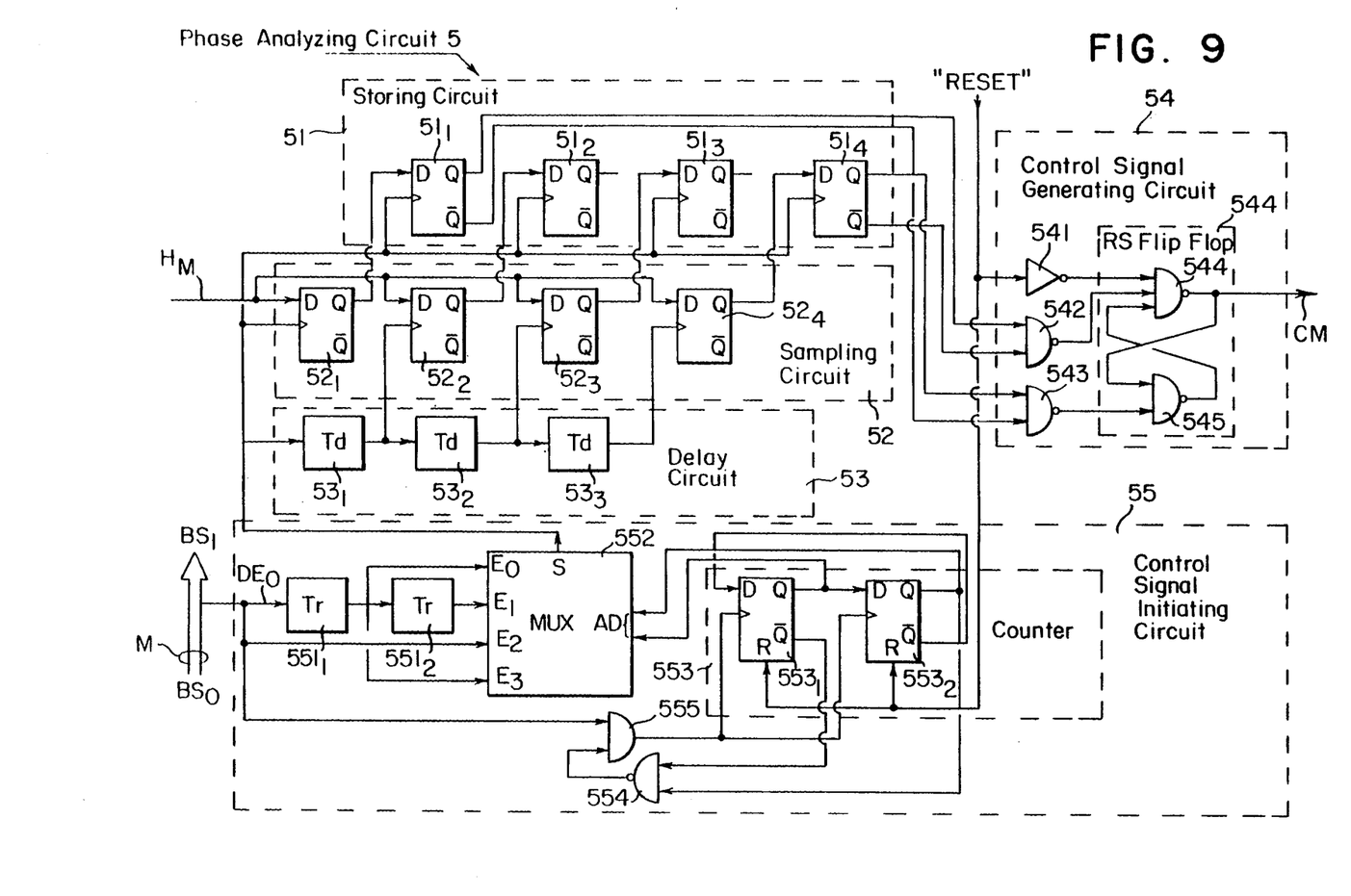
FIG. 9 shows a block diagram of a second embodiment of a phase analyzing circuit included in the parallel-to-serial converter embodying the invention and intended to remedy jitter effects.

The second and third flip-flops $52_2$ and $52_3$, $51_2$ and $51_3$, in circuits 52 and 51 may in practice be suppressed and are only shown in FIG. 6 (or 9) to help understand the operation of circuit 5.

In referring once again to FIG. 6, the control signal generating circuit 54 is designed to generate the signal CM controlling switch 6 so that the outputs of flip-flops $51_1$ to $51_4$ contribute in combination to select the second clock signal $H_{M'}$ or the second inverted clock signal $H_{M'}$ at the output of switch 6, in correspondence with the TV table. As appears in this table, only Q and $\overline{Q}$ outputs of the first and last flip-flops $51_1$ and $51_4$ in the storing circuit 51 are required to generate the control signal CM.

The generating circuit 54 comprises an inverter 521, two two-input NAND gates 542 and 543 and a multiple input RS flip-flop 544. The RS flip-flop comprises a 3-input NAND gate 544 and a 2-input NAND gate 545, the output of gate 544 producing the control signal CM. A double storing input EM of the RS flip-flop 544 is comprised of two inputs of gate 544 which are connected to an input of the RESET signal through the inverter 541 and to the output of gate 542 the inputs of which are connected to the output Q of flip-flop $51_1$ and the complementary output $\overline{Q}$ of flip-flop $51_4$, respectively. An erase input EE of flip-flop RS 544 is comprised of an input of gate 545 which is connected to the output of gate 543 the inputs of which are linked to the complementary output $\overline{Q}$ output of flip-flop $51_1$ and the output Q of flip-flop $51_4$, respectively. Circuit 54 is equivalent to an RS flip-flop having two excitation inputs: one single set to "1" (set) input and one reset-to-"0" (reset) input defined by the logic relations:

$S = RESET + Q_1 \cdot Q_4$; and $R = Q_4 \cdot Q_1$ in which $Q_1$ and $Q_4$ denote respectively data outputs Q of flip-flops $51_1$ and $51_4$.

Thus the output signal of the equivalent RS flip-flop, i.e. the control signal CM, is in the state "1" when $Q_1$ is at state "1" and $Q_4$ is at state "0" as defined by the excitation function S. Inversely, the signal CM is at state "0" when $Q_1$ is at state "0" and $Q_4$ is at state "1", as defined by the excitation function R. In the case of $Q_4$ and $Q_1$ both are at state "1" or "0", the previous state of the CM signal is maintained in compliance with the operation of the RS flip-flops since R=S="0". The RESET signal is used to force the output of RS flip-flop 544 and thereby the signal CM to a given state "1" during an initiation phase.

The first embodiment of the parallel-to-serial converter embodying the invention described previously in particular in reference to FIGS. 6 and 7, is preferably used when phase jitter is not likely to hinder transfer of incoming data.

The second embodiment of the parallel-to-serial converter embodying the invention and described below, in particular in reference to FIGS. 8 and 9, remedies the effects of phase jitter.

As shown in the truth table TV, it appears that a change of state of the control signal CM, which implies substituting the clock signal $H_{M'}$ for $H_{M'}$ or vice versa to time the transfer of incoming data words DE occurs when the outputs $Q_1$ and $Q_4$ of flip-flops $51_1$ and $51_4$ of the storing circuit 51 toggle states "1" and "0" into states "0" and "1", or states "0" and "1" into states "1" and "0", respectively.

Figure 8:
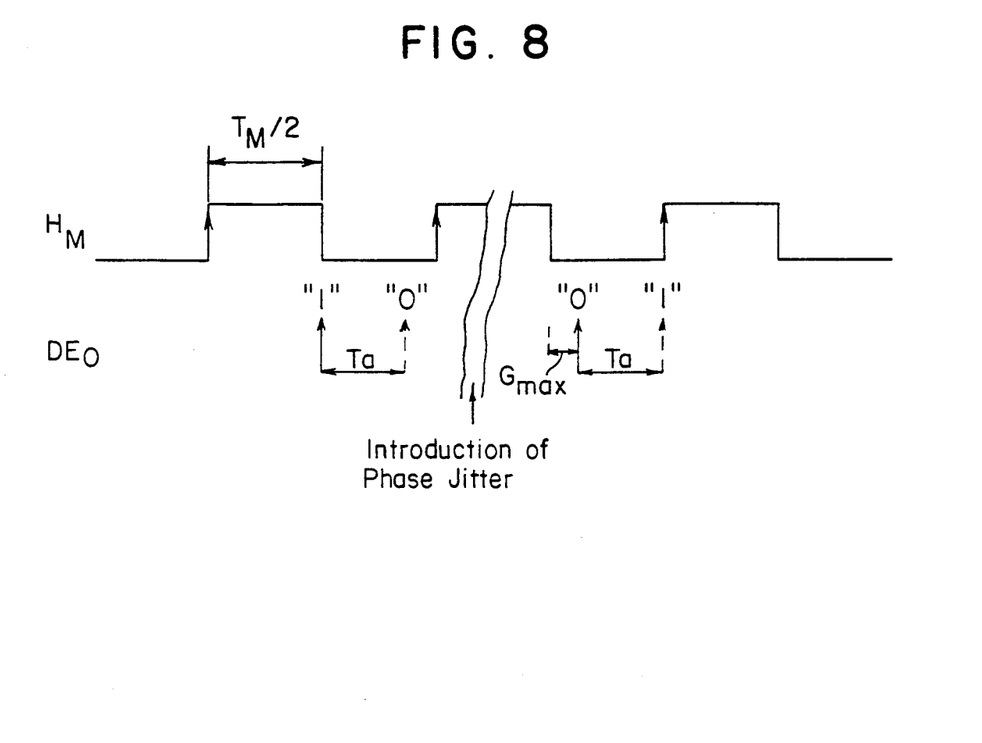
FIG. 8 shows a time diagram of a "first" clock signal, presenting the effects due to jitter in incoming data signals to be converted.

On the first line of FIG. 8 is shown the clock signal $H_M$ whereas a second line in this FIG. 8 shows an extreme case with $G_{max}$ phase jitter of incoming data leading to a phase jump of the selected HS signal timing the parallel-to-parallel register, or to be more exact, a change in the selection of both clock signals $H_{M'}$ and $H_{M'}$. A phase jitter of incoming data DE taking a maximal value given by $$G_{max} = T_M/2 - Ta,$$

in which $T_M$ is the period of the clock signal $H_M$ and Ta is the analysis duration equal to the sum of the three elementary delays Td imposed by the delay lines $53_1$, $53_2$ and $53_3$ of the delay circuit 53, causes a change of selected clock signal HS. In accordance o with the truth table TV, the example shown in FIG. 8 corresponds to the toggling of outputs $Q_1$ and $Q_4$ of flip-flops $51_1$ and $51_4$, of states "1" and "0" to states "0" and "1" and a change of selected signal HS from $H_{M'}$ to $H_{M'}$.

In the remainder, reference is made to a preferred embodiment wherein the analysis duration Ta is equal to a quarter of the period of the clock signal $H_M$, i.e. $Ta = T_M/4$. In this example, the value of the maximal jitter $G_{max}$ is equal to 12 ns for a clock frequency of the serial processing clock signal H being equal to 155 MHz and for data words comprised of M=8 bits, which corresponds to an upper phase jitter limit hat is broadly acceptable even under extreme conditions. Acceptable phase jitter is less than this $G_{max}$ phase jitter.

Nonetheless, with a phase jitter for incoming data less than $G_{max}$, and given the above mentioned condition on Ta ($Ta = T_M/4$), outputs Q of flip-flops $51_1$ to $51_4$ may toggle from given states to immediately adjacent states in the truth table TV. To be more exact, outputs Q of flip-flops $51_1$ to $51_4$ may only toggle towards either superior states immediately adjacent to them or inferior states immediately adjacent to them in the truth table TV. Thus by way of example, outputs Q of flip-flops $51_1$ and $51_4$ may toggle from states "0" and "0" either to the states "0" and "1" or to the states "1" and "0". It was shown when referring to FIG. 6 that a RESET signal when initiating the converter forces the output of RS flip-flop 544 and thereby the control signal CM to the state "1". However it is possible, following this reset step that the initial "natural" output states of flip-flops $51_1$ and $51_4$ were either "0" and "0" or "1" and "1" (truth table), thus maintaining the control signal CM in the state "1". But it was shown previously that phase jitter G of incoming data DE may cause given states of flip-flops $51_1$ and $51_4$ to toggle to immediately adjacent superior or inferior states.

Thus, in reference to the truth table TV, states "0" and "0", or "1" and "1", respectively stored at the outputs of flip-flops $51_1$ and $51_4$, and corresponding to a state "1" of the control signal CM following resetting (RESET—"1") of the converter, may toggle to the states "0" and "1". The control signal then takes the state "0" and imposes a change of phase of the selected clock signal HS after resetting, change of phase which is very harmful to the operation of the converter and may lead to loss of data. Suppose now that immediately after initiation of the control signal CM at the state "1" by the RESET signal, the control signal CM toggles to the state "0" with an increase of phase jitter G in which case the CM signal cannot then toggle back to state "1" since, as mentioned above, given the conditions on the phase jitter G ($G < G_{max}$) and on the analysis duration Ta, the states of the outputs of flip-flops $51_1$ to $51_4$ can only toggle from given states to states immediately adjacent either superior or inferior, as seen in truth table TV, by positive and negative swing of the phase jitter.

The problems of phase jitter only arise therefore if the initial "natural" output of RS flip-flop 544 producing the control signal CM takes a state "1" identical to the state to which the RS flip-flop is initially forced on initiation by the RESET signal. To be more exact, this phase jitter problem arises if the outputs of flip-flops 511 and $51_4$ take the states "1", "1" or "0", "0" while maintaining the control signal CM at the state "1". Indeed, in this case phase jitter can make the outputs of flip-flops $51_1$ to $51_4$ to toggle to immediately adjacent states, i e. "0" and "1" for flip-flops $5_1$ and $51_4$, leading to a change of phase of the selected clock signal HS. It must however be noted that, if data signal jitter is less than the maximum phase jitter $G_{max}$, this phase jump Will only occur once.

FIG. 9 shows a second embodiment of a phase analyzing circuit 5A included in a parallel-to-serial converter embodying the invention and solving this phase jitter problem. The circuit 5A comprises the storing circuit 51, the sampling circuit 52, the delay circuit 53 and the control signal generating circuit 54, identical to and arranged in the same way as those in the previous circuit 5 shown in FIG. 6. The phase analyzing circuit 5A also comprises a control signal initiating circuit 55. This circuit 55 comprises two cascade-connected delay lines $551_1$ and $551_2$ each imposing an elementary delay Tr, a 4-to-1 multiplexer 552, one synchronous 2-bit counter 553 comprising two D type flip-flops $553_1$ and $553_2$, a 2-input NAND gate 554 and a 2-input AND gate 552.

Four inputs $E_0$, $E_1$, $E_2$ and $E_3$ of multiplexer 552 receive the signal concerning one predetermined wire from the input bus of the converter, for example that corresponding to the low order bit signal $DE_O$ of data words with M parallel bits DE, through the two delay lines $551_1$ to $551_2$, directly and through the first delay line $551_1$, respectively. Two address inputs AD of multiplexer 552 are connected to two respective outputs Q of the counter 553 and select inputs $E_0$, $E_1$, $E_2$ and $E_3$ when AD="00", "10", "11" and "01", respectively. An output S of the multiplexer 552 is applied to the input of the first delay line $53_1$ in the delay circuit 53, to the clock input of the first flip-flop $52_1$ in the sampling circuit 52 and to the clock inputs of flip-flops $51_1$ to $51_4$ in the storing circuit 51, in the same way as the predetermined bit signal $DE_O$ is directly applied in circuit 5 shown in FIG. 6.

The two inputs of gate 554 are connected to the data output Q of flip-flop $553_2$ and to the complementary data output Q of flip-flop $553_1$, respectively. Thus the output of NAND gate 554 is at state "0" for states "0" and "1" stored at respective Q outputs of flip-flops $553_1$ and $553_2$ of the counter 553. The output of gate 554 and the predetermined bit signal $DE_O$ are applied to the inputs of the AND gate 555 respectively. The $DE_O$ signal is only enabled at the output of gate 555 for respective states stored at the outputs Q of flip-flops $553_1$ and $553_2$ of the counter 553 which are different from "0" and "1". This $DE_O$ signal is provided to clock inputs of flip-flops $553_1$ and $553_2$. In the synchronous counter 553, the complementary data output $\overline{Q}$ of the second flip-flop $553_2$ is back-looped to the data input D of the first flip-flop $553_1$. The resetting signal RESET applied to an input on the control signal generating circuit 54 so as to force the control signal CM to the state "1" at the initiation phase is also applied to two R reset inputs of flip-flops $553_1$ and $553_2$ of counter 553.

As mentioned previously, the control signal initiating circuit 55 is intended to position the control signal CM at a definitive stable state during the converter initiation step.

During the initiation step, the reset signal RESET controls the resetting to zero "0" and "0" of outputs Q of the counter 553. Three successive rising edges of the predetermined bit signal $DE_O$ set the outputs S of flip-flops $553_1$ and $553_2$ in this counter to the states "1" and "0" then "1" and "1" then "0" and "1", respectively. These last two states "0" and "1" of counter 553 are therefore no longer modified since the output of the NAND gate 554 is at state "0" which does not enable the predetermined bit signal $DE_O$ through the AND gate 555 which is closed.

For these four pairs of successive states at the outputs Q of counter 553, the inputs $E_0$, $E_1$, $E_2$ and $E_3$ are respectively selected as output S of multiplexer 552. Successively DEO signals, respectively delayed by Tr, then by 2Tr, then not delayed and finally delayed once again by Tr are selected as output S of multiplexer 552.

The delay Tr is substantially taken as being equal to peak maximal jitter $G_{max}$ supported by the converter.

The use of the two delay lines $551_1$ and $551_2$, constitute a means of studying the behavior of the converter in the presence of phase jitter for positive and negative maximum swings of this phase jitter around an average phase of the predetermined bit signal $DE_O$ determined by the phase of the signal $DE_O$, then delayed by Tr by the delay line $551_1$.

As pointed out previously in the description, if the phase jitter G is less than the maximal phase jitter $G_{max}$, then during these two phase changes by positive and negative swings of the phase jitter, the control signal CM keeps or takes a definitive stable state and the selected clock signal HS, therefore, does not undergo any phase change.

Given that during initiation the RESET signal forces the control signal CM to the state "1" to select the clock signal $H_M'$, two cases may arise during this initiation. If, during positive and negative swings of the input data signal phase on both sides of a phase of $DE_O$ signal delayed by Tr, the control signal CM is maintained at the state "1", then this state is definitive. If, during these swings, the CM signal toggles to the state "0", which corresponds to the states "1" and "1", or "0" or "0", stored at the outputs of flip-flops $51_1$ and $51_4$ following application of signal RESET and before positive and negative swings of the phase jitter of the predetermined bit signal $DE_O$, respectively, then this state "0" is definitively maintained for the control signal CM, and the clock signal $H_M$ is selected to time the parallel-to-parallel register 3. It should be noted that this phase jitter problem only arises when the control signal CM takes a state "1" after RESET, and that this state "1" corresponds to the outputs of flip-flops 511 and 514, at "0" and "0", or "1" and "1" respectively.

As pointed out previously the maximal phase jitter $G_{max}$ acceptable by the parallel-to-serial converter embodying the invention is directly dependent on the analysis duration Ta equal to the sum of the three delays Td imposed by delay lines $53_1$ to $33_3$ of the delay circuit 53.

According to a first alternative of the invention, each of the delay lines is obtained using an even number of cascade arranged inverters in a string. Each inverter produces a delay depending on the dimensions of the transistors comprising it.

Figure 10:
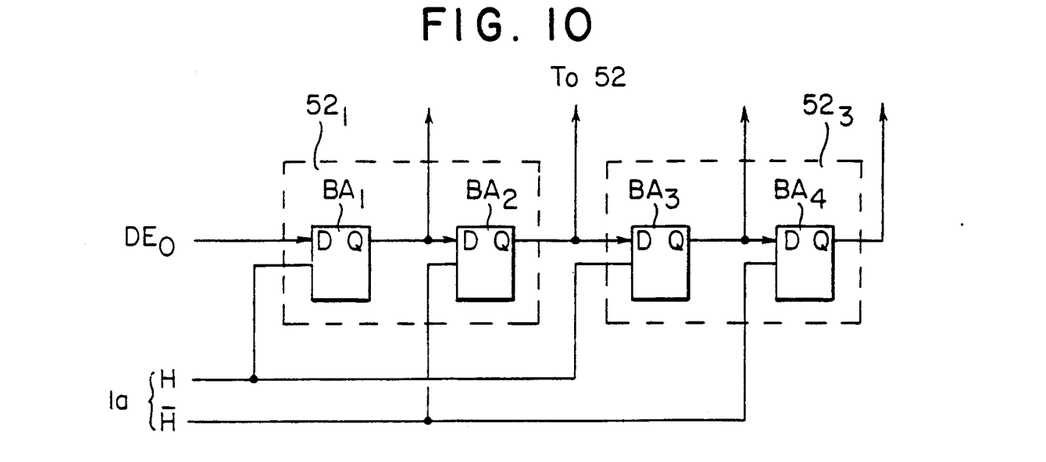
FIG. 10 shows in detail an embodiment of a flip-flop based delay circuit included in the phase analyzing circuit.

According to a second alternative shown in FIG. 10, the delay circuit 53 is comprised of several D type flip-flops, BA, connected in cascade. The data input on the first flip-flop $BA_1$ receives the predetermined bit signal $DE_O$ according to FIG. 6, or the output signal S from the multiplexer 552 according to FIG. 9. The output Q of each of the other flip-flops is connected to the input D of the following respective flip-flop. Each of the delay lines $53_1$ to $53_3$ can comprise one or more flip-flops the number of which depends on the analysis duration Ta and the number of bits M in the data words DE, i.e. the ratio M between the frequency of the bit clock signal H and HS. The clock inputs of flip-flops BA receive alternatively one out of two, respectively the serial processing clock signal H and the complementary signal $\overline{H}$ of the latter. Thus each flip-flop induces a delay equal to a half-period of the clock signal H.

By way of example, FIG. 10 illustrates a delay circuit 53 comprised of two delay lines $53_1$ to $53_3$ each imposing a delay Td equal to a half-period of the clock signal H and each including two flip-flops $BA_1$ and $BA_2$, $BA_3$ and $BA_4$ so as to confer a phase analysis duration Ta equal to a period and a half of the signal H.

We claim:

1. A parallel-to-serial converter receiving incoming data words each having M parallel bits from a digital processing device for converting them into serialized bits transmitted at a first frequency in a transmission medium, comprising
    a time base receiving a clock signal at said first frequency and producing
        (1)—a loading clock signal at a second frequency M times less than said first frequency to rhythm a loading of said incoming data words which are received and which are previously transferred to outputs of a parallel-to-parallel register in a parallel-to-serial register,
        (2)—a first clock signal at said second frequency transmitted to said digital processing device to synchronize said digital processing device, and
        (3)—two second clock signals at said second frequency and substantially in opposition of phase to each other, and
    a phase analyzing means for analyzing the phase of said incoming data words compared to the phase of said first clock signal in order to select one of said two second clock signals according to whether said incoming data words and said first clock signal are approximately in phase and in opposition of phase, respectively, in a selected clock signal which rhythms a transfer of said incoming data words to said outputs of the parallel-to-parallel register.

2. The parallel-to-serial converter as claimed in claim 1, wherein one of said two second clock signals is substantially in phase lead with respect to said first clock signal.

3. The parallel-to-serial converter as claimed in claim 1, wherein loading times of said parallel-to-serial register determined by said loading clock signal occur periodically substantially after transfer times of said incoming data words determined by any one of the two second clock signals.

4. A parallel-to-serial converter receiving incoming data words each having M parallel bits from a digital processing device for converting them into serialized bits transmitted at a first frequency in a transmission medium, comprising
    (a) a time base receiving a clock signal at said first frequency and producing
        (1) a loading clock signal at a second frequency M times less than said first frequency to rhythm a loading of said incoming data words which are received and which are previously transferred to outputs of a parallel-to-parallel register in a parallel-to-serial register,
        (2) a first clock signal at said second frequency transmitted to said digital processing device to synchronize said digital processing device, and
        (3) two second clock signals at said second frequency and substantially in opposition of phase to each other, a first of said second clock signals being produced directly and a second of said second clock signals being produced through a logic inverter receiving said first of said second clock signals, and
    (b) a phase analyzing means for analyzing the phase of said incoming data words compared to the phase of said first clock signal in order to select one of said two second clock signals according to whether said incoming data words and said first clock signal are approximately in phase and in opposition of phase, respectively, in a selected clock signal which rhythms a transfer of said incoming data words to said outputs of the parallel-to-parallel register.

5. A parallel-to-serial converter receiving incoming data words each having M parallel bits for a digital processing device for converting them into serialized bits transmitted at a first frequency in a transmission medium, comprising
    (a) a time base receiving a clock signal at said first frequency and producing (1) a loading clock signal at a second frequency M times less than said first frequency to rhythm a loading of said incoming data words which are received and which are previously transferred to outputs of a parallel-to-parallel register in a parallel-to-serial register, (2) a first clock signal at said second frequency transmitted to said digital processing device to synchronize said digital processing device, and (3) two second clock signals at said second frequency and substantially in opposition of phase to each other, and (b) a phase analyzing means for analyzing the phase of said incoming data words compared to the phase of said first clock signal in order to select one of said two second clock signals according to whether said incoming data words and said first clock signal are approximately in phase and in opposition of phase, respectively, in a selected clock signal which rhythms a transfer of said incoming data words to said outputs of the parallel-to-parallel register, said phase analyzing means comprising (1) several cascade-connected delay means imposing delays the sum of which defines a predetermined phase analysis duration, to delay one of predetermined of M bit signals relative to said M parallel bits in said incoming data words in several delayed signals, respectively, said analysis duration being less than a half-period of said clock signals at the second frequency, (2) several sampling means for sampling said first clock signal in response to predetermined logic transitions in said one predetermined of the M bit signal and said delayed signals in order to produce several sampling signals respectively, and (3) a logic means for generating as a function of two of said several sampling signals a control signal whose two logic states select said two second clock signals, respectively.

6. The parallel-to-serial converter as claimed in claim 5 comprising a switching means receiving said second clock signals through two respective inputs and receiving said control signal through a control input for applying one of said two second clock signals to the parallel-to-parallel register as a function of the logic state of said control signal into said selected clock signal.

7. The parallel-to-serial converter as claimed in claim 5 wherein said phase analyzing means further comprises several storing means connected between said several sampling means and said logic means for storing logic states of said sampling signals produced respectively by said several sampling means for a duration of transmission of one of said incoming data words.

8. The parallel-to-serial converter as claimed in claim 5 wherein said two of the several sampling signals result from sampling of said first clock signal by said one of the predetermined M bit signals and a most delayed of said several delayed signals, and said logic means comprises a first input means sensitive to one of said two of the several sampling signals and to a signal inverted with respect to the other of said two of the several sampling signals for generating an initial logic state of said control signal selecting one of said two second clock signals, and a second input means sensitive to the other of said two of the several sampling signals and to a signal inverted with respect to said one of said two of the several sampling signals for generating a second logic state of said control signal selecting the other of said two second clock signals.

9. The parallel-to-serial converter as claimed in claim 5 wherein said phase analyzing means further comprises a means for forcing the control signal into a forced signal at a given state selecting one of said two second clock signals during an initial operating stage of said parallel-to-serial converter, and said one predetermined of the M bit signals is received through a control signal initiating means to initiate to a stable definitive state during said initial procedure said forced control signal independently of any phase jitter in said incoming data words less than a maximal phase jitter.

10. The parallel-to-serial converter as claimed in claim 9 wherein said maximal phase jitter is substantially equal to the difference between the half-period of said clock signals at the second frequency and said phase analysis duration.

11. The parallel-to-serial converter as claimed in claim 9, wherein said initiating means comprises first and second delay means connected in cascade receiving said one predetermined of the M bit signals to produce first and second delayed signals, respectively, and a means for selecting during said initial stage, successively said first delayed signal, then said second delayed signal, then said one predetermined of the M bit signals, and finally said first delayed signal, each of said first and second delay means imposing a delay substantially equal to said maximal phase jitter.

12. The parallel-to-serial converter as claimed in claim 5 wherein each of said several cascade-connected delay means comprises at least one flip-flop, flip-flops of said several cascade-connected delay means being connected in cascade and having clock inputs receiving alternately, one out of two, said clock signal at said first frequency and a signal complementary to the latter.

* * * * *